United States Patent
Choi et al.

(10) Patent No.: US 10,739,822 B2
(45) Date of Patent: Aug. 11, 2020

(54) BLOWER AND DOCKING DEVICE COMPRISING BLOWER

(71) Applicant: Samsung Electronics Co., Ltd., Gyeonggi-do (KR)

(72) Inventors: Eun Ha Choi, Gyeonggi-do (KR); Goang Tae Kim, Gyeonggi-do (KR); Yong Seok Bang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/485,915

(22) PCT Filed: Feb. 9, 2018

(86) PCT No.: PCT/KR2018/001766
§ 371 (c)(1),
(2) Date: Aug. 14, 2019

(87) PCT Pub. No.: WO2018/151472
PCT Pub. Date: Aug. 23, 2018

(65) Prior Publication Data
US 2020/0057469 A1     Feb. 20, 2020

(30) Foreign Application Priority Data

Feb. 17, 2017    (KR) .................. 10-2017-0021681

(51) Int. Cl.
*G06F 1/16*    (2006.01)
*H02J 7/02*    (2016.01)
(Continued)

(52) U.S. Cl.
CPC .............. *G06F 1/1632* (2013.01); *H02J 7/02* (2013.01); *H04M 1/04* (2013.01); *H05K 7/20136* (2013.01)

(58) Field of Classification Search
CPC ......... H05K 7/20136–20172; G06F 1/20–203; G06F 1/1632; H04M 1/04; H04M 1/06
(Continued)

(56) References Cited

U.S. PATENT DOCUMENTS

| 8,376,303 B2 * | 2/2013 | Yang ...................... F16M 11/22 248/146 |
| 8,464,995 B2 | 6/2013 | Yang et al. |

(Continued)

FOREIGN PATENT DOCUMENTS

| KR | 1020120080986 | 7/2012 |
| KR | 101482601 | 1/2015 |

(Continued)

OTHER PUBLICATIONS

PCT/ISA/210 Search Report issued on PCT/KR2018/001766, pp. 5.
PCT/ISA/237 Written Opinion issued on PCT/KR2018/001766, pp. 4.

*Primary Examiner* — Zachary Pape
(74) *Attorney, Agent, or Firm* — The Farrell Law Firm, P.C.

(57) ABSTRACT

According to an embodiment of the disclosure, a docking device to mount an electronic device may include a blowing device to generate and output wind, and a stand device to support the blowing device. The blowing device may include a front cover, which includes a main body at least partially making contact with the electronic device, a guard that surrounds the main body and is spaced apart from the main body by a specific distance, and a plurality of through holes that are disposed at a rim of the main body, a rear cover coupled to the front cover to slide on the stand device based on physical force applied onto the front cover, and a fan interposed between the front cover and the rear cover.

15 Claims, 11 Drawing Sheets

(51) Int. Cl.
*H04M 1/04* (2006.01)
*H05K 7/20* (2006.01)

(58) Field of Classification Search
USPC .................. 361/679.46–679.54, 688–723
See application file for complete search history.

(56) References Cited

U.S. PATENT DOCUMENTS

| | | |
|---|---|---|
| D700,613 S | 3/2014 | Wong |
| 8,926,414 B1 | 1/2015 | Kirkpatrick |
| 8,954,120 B2 | 2/2015 | Yoo et al. |
| 9,030,813 B2 | 5/2015 | Chang et al. |
| D736,211 S | 8/2015 | Kirkpatrick |
| 9,229,499 B2 | 1/2016 | Kirkpatrick |
| 9,620,972 B2 * | 4/2017 | Oh .................. H02J 7/0044 |
| 10,110,043 B2 * | 10/2018 | Moon .................. H02J 7/04 |
| 10,495,104 B2 * | 12/2019 | Park .................. B01D 46/0008 |
| 10,551,873 B2 * | 2/2020 | Han .................. G06F 1/1632 |
| 2012/0178508 A1 | 7/2012 | Yoo et al. |
| 2012/0325999 A1 | 12/2012 | Yang et al. |
| 2014/0192471 A1 | 7/2014 | Chang et al. |
| 2014/0268542 A1 * | 9/2014 | Moon .................. G06F 1/1632 |
| | | 361/679.41 |
| 2015/0124398 A1 | 5/2015 | Kirkpatrick |
| 2018/0288898 A1 * | 10/2018 | Jeong .................. G06F 1/1632 |
| 2020/0083726 A1 * | 3/2020 | Kim .................. H02J 50/80 |

FOREIGN PATENT DOCUMENTS

| | | |
|---|---|---|
| KR | 1020150021318 | 3/2015 |
| KR | 1020160057247 | 5/2016 |

* cited by examiner

BLOWER AND DOCKING DEVICE COMPRISING BLOWER

PRIORITY

This application is a National Phase Entry of PCT International Application No. PCT/KR2018/001766 which was filed on Feb. 9, 2018, and claims priority to Korean Patent Application No. 10-2017-0021681, which was filed on Feb. 17, 2017, the content of each of which is incorporated herein by reference.

TECHNICAL FIELD

Embodiments disclosed in the disclosure relate to a technology of reducing heat emitted from the electronic device.

BACKGROUND ART

With the development of mobile communication technologies, an electronic device, such as a smartphone, a wearable device, or the like, which is equipped with a display, has been widely supplied. A user may perform various functions, such as taking a photo or a moving picture, reproducing of a music file, a moving picture file, or playing a game, or web-browsing, through the electronic device.

As described above, as various functions are performed through the electronic device, the time for the user to use the electronic device has been gradually increased. When the use time of the electronic device by the user is increased, the fatigue of the user may be increased. For example, when a user views a moving picture (e.g., a film) while holding the electronic device with the hand of the user, the user has to be in a specific posture for a long time, so the fatigue of the user may be increased. Accordingly, recently, the technology associated with a device (e.g., a docking device) to mount the electronic device has been developed.

DISCLOSURE

Technical Problem

When the use time of the electronic device is increased, heat emitted from the electronic device may be increased. The heat may cause components included in the electronic device to malfunction, and the damage may be caused to the components. In particular, when the electronic device is mounted on the docking device, as the electronic device is in direct contact with the docking device, a surface for discharging heat emitted from the electronic device may be decreased. The heat, which fails to be discharged to the outside, may cause the damage to the electronic device.

Embodiments disclosed in the disclosure are to provide a blowing device and a docking device to solve the above problems and to resolve the issues raised herein.

Technical Solution

According to an embodiment disclosed in the disclosure, a docking device to mount an electronic device may include a blowing device to generate and output wind, and a stand device to support the blowing device. The blowing device may include a front cover, which includes a main body at least partially making contact with the electronic device, a guard that surrounds the main body and is spaced apart from the main body by a specific distance, and a plurality of through holes that are disposed at a rim of the main body, a rear cover coupled to the front cover to slide on the stand device based on physical force applied onto the front cover, and a fan interposed between the front cover and the rear cover. One end of the guard may be bent toward the center of the main body, and an opposite end of the guard may be coupled to the rear cover. The stand device may include a housing including a groove having a shape corresponding to the rear cover such that at least a portion of the front cover is positioned in the housing, when the rear cover slides, a sensor to sense an angle at which the front cover is inclined in the housing, and a processor to control an operation speed of the fan based on the angle sensed by the sensor.

According to an embodiment disclosed in the disclosure, a blowing device may include a rear cover including a plurality of holes allowing external air to be introduced into the blowing device, a fan to generate wind by rotating the introduced external air, and a front cover including at least one or more through holes which are disposed at a rim and allow the wind to pass through the holes. The fan may include a front plate parallel to the front cover, a rear plate opposite to the front plate, a propeller disposed in parallel to the front plate, between the front plate and the rear plate, and a motor to rotate the propeller. The through holes may be bent such that the wind passing between the front plate and the rear plate moves to an electronic device making contact with the front cover.

Advantageous Effects

According to embodiments disclosed in disclosure, the heat emitted from the electronic device may be reduced.

Besides, a variety of effects directly or indirectly understood through the disclosure may be provided.

MODE FOR INVENTION

Figure 1:
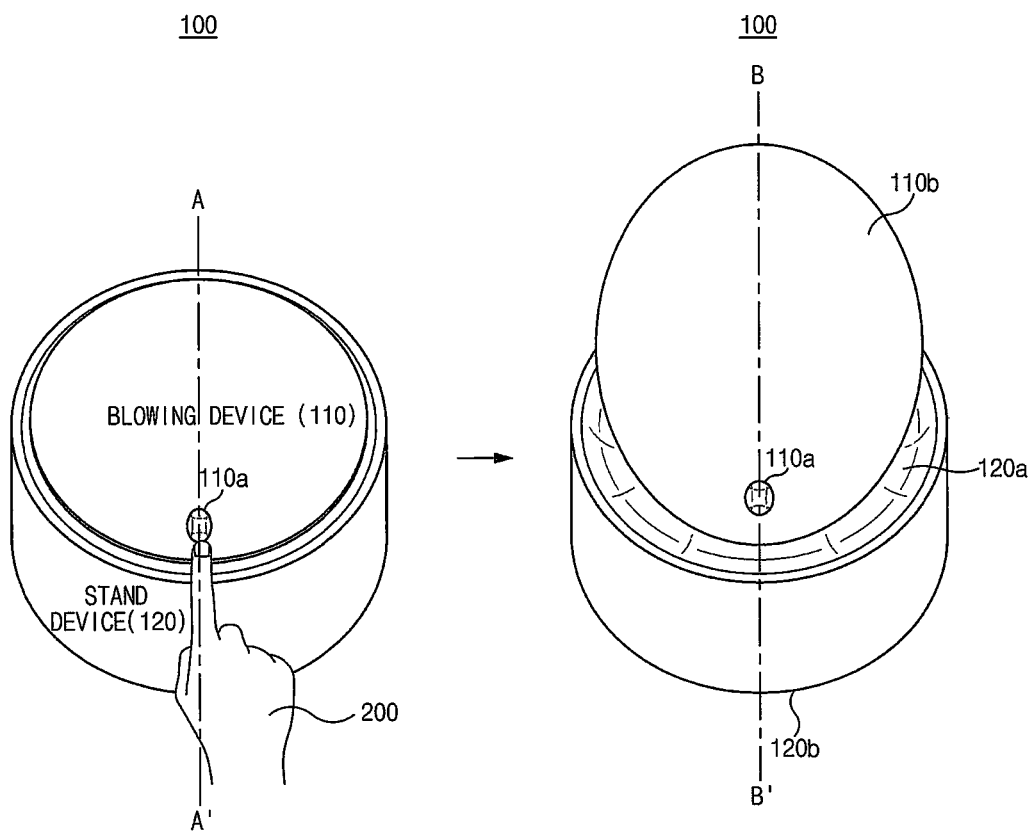
FIG. 1 is a view illustrating an operating environment of a docking device, according to an embodiment.

Hereinafter, various embodiments of the disclosure may be described with reference to accompanying drawings.

Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when an component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle information devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the disclosure may not be limited to the above-described electronic devices and may include other electronic devices and new electronic devices according to the development of technologies.

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

FIG. 1 is a view illustrating an operating environment of a docking device, according to an embodiment.

Referring to FIG. 1, a docking device 100 may include a blowing device 110 and a stand device 120. In the disclosure, the blowing device 110 and the stand device 120 may be referred to as a front case and a rear case, respectively.

Referring to FIG. 1, the blowing device 110 is movable on the stand device 120 based on a user input. For example, a mark 110a (e.g., a groove) for a point allowing a user 200 to press the blowing device 110 may be present on the surface of the blowing device 110. When the user 200 pushes the blowing device 110 in a specific direction by pressing the mark 110a, the blowing device 110 may move in a direction (e.g., a downward curved diagonal direction) that the user 200 pushes the blowing device 110.

According to an embodiment, a surface 120a on which the blowing device 110 is coupled to the stand device 120 may be curved surface. Accordingly, when the user pushes the blowing device 110, a portion of a surface 110b of the blowing device may be introduced into the stand device 120 along the curved surface 120a, In this case, another portion of the surface 110b of the blowing device may protrude outward by an area introduced into the stand device 120. In this regard, the surface 110b of the blowing device 110 may have a substantially circular shape (or an oval shape or a polygonal shape, or the like), and a bottom surface of the blowing device 110 may have a convex-down shape.

The stand device 120 may fix the blowing device 110 to prevent the blowing device 110 from deviating from a specific range while the blowing device 110 is moving in a specific direction. For example, when the user 200 pushes the blowing device 110, a portion of the blowing device 110 may be introduced into the stand device 120. In this case, the stand device 120 may fix (temporarily fix) the blowing device 110 such that the inclination of the blowing device 110 is maintained. In the disclosure, the inclination of the blowing device 110 may refer to an angle formed between the surface 110b of the blowing device and a bottom surface 120b of the stand device.

According to an embodiment, the stand device 120 may fix the blowing device 110 such that the blowing device 110 is movable within a specific range without being separated from the stand device 120. For example, when the user pushes the blowing device 110 by a specific distance or more, the blowing device 110 may be separated from the stand device 120 after moving on the stand device 120. Accordingly, when the inclination of the blowing device 110 becomes a specific angle, the stand device 120 may fix (temporarily fix) the blowing device 110 such that the blowing device 110 is not inclined any more.

According to an embodiment, the stand device 120 may be provided in a cylinder shape and be engraved with a concave pattern at the central portion thereof. The blowing device 110 may be mounted in the engraved area.

Figure 2:
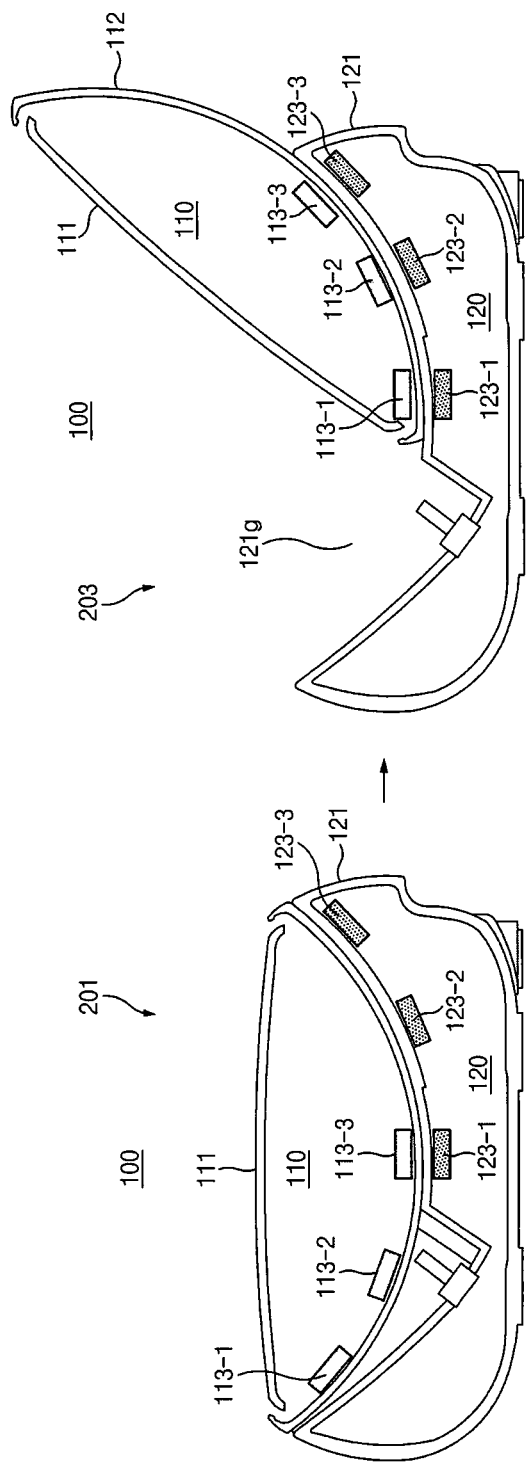
FIG. 2 illustrates a sectional view of a docking device, according to an embodiment.

FIG. 2 illustrates a sectional view of the docking device, according to an embodiment. For example, FIG. 2 illustrates sectional views taken along line A-A' and B-B of the docking device 100 illustrated in FIG. 1.

Referring to FIG. 2, the blowing device 110 may include a front cover 111 and a rear cover 112. The front cover 111 may be a frame making direct contact with the electronic device (e.g., a smart phone). The front cover 111 may be referred to as, for example, the surface 110b of the blowing device described with reference to FIG. 1

The rear cover 112 may be a frame coupled to the front cover 111 and making direct contact with the stand device 120. The rear cover 112 may be formed in a curved surface such that the blowing device 110 slides on the stand device 120.

The stand device 120 may include a housing 121 forming an outer appearance of the stand device 120. The housing 121 may have a groove 121g in a shape corresponding to the rear cover 112 such that at least a portion of the front cover 111 is positioned inside. For example, as described with reference to FIG. 1, the groove 121g may be formed in the housing 121 such that a portion of the surface of the blowing device 110 (or a portion of the front cover 111) is introduced into the stand device 120 when the user pushes the blowing device 110.

According to an embodiment, a plurality of magnets 113-1 to 113-3 and 123-1 to 123-3 are disposed in the rear cover 112 and the surface of the housing 121. The stand device 120 may sense the inclination of the blowing device 110 based on the magnetic field generated between the magnets 113-1 to 113-3 disposed on the rear cover 112 and the magnets 123-1 to 123-3 disposed on the surface of the housing 121. For example, in left drawing 201 of FIG. 2, the magnet 113-3 is close to the magnet 123-1, so the stand device may determine that the blowing device 110 is not inclined. However, as in right drawing 203 of FIG. 2, as the blowing device 110 moves, the magnets 113-1 and 123-1 (or the magnets 113-2 and 123-2, and the magnets 113-3 and 123-3) are close to each other, so the stand device 120 may sense the inclination of the blowing device 110.

Figure 7:
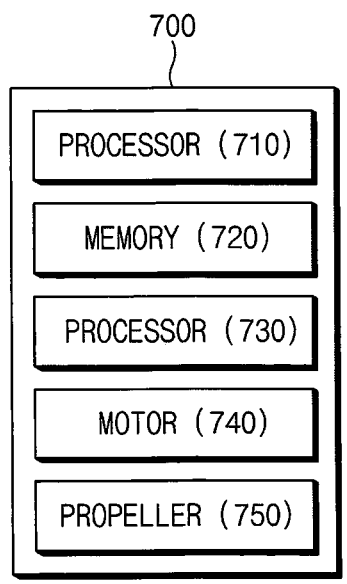
FIG. 7 illustrates a block diagram of a docking device, according to an embodiment.

According to an embodiment, the stand device 120 may include a sensor (e.g., the sensor 710 of FIG. 2), a memory (e.g., the memory 720 of FIG. 7), and a microcomputer (e.g., the processor 730 of FIG. 7). The sensor 710 may sense the magnetic flux of each of the magnets 113-1, 113-2, and 113-3. The memory 720 may store a look-up table obtained by mapping the number of magnets, which are changed in magnetic flux, with the inclination of the blowing device 110. The microcomputer 730 may determine the number of magnets changed in magnetic flux, based on the sensed magnetic flux and may determine the inclination of the blowing device 110 based on the look-up table.

According to an embodiment, in the docking device 100, the blowing device 110 may be fixed (temporarily fixed) to the stand device 120 by using magnetic force (attractive force) between the magnets 113-1 to 113-3 disposed on the rear cover 112 and the magnets 123-1 to 123-3 disposed on the surface of the housing 121. For example, in the left drawing 201 of FIG. 2, the docking device 100 may fix (temporarily fix) the blowing device 110 using the magnetic force of the magnet 113-3 and the magnet 123-1. Meanwhile, in the right drawing 203 of FIG. 2, the docking device 100 may fix (temporarily fix) the blowing device 110 by using the magnet 113-1 and the magnet 123-1 (and/or the magnet 113-2 and 123-2, and the magnet 113-3 and the magnet 123-3).

In the disclosure, components having the same reference numerals as reference numerals of components of the docking device 100 illustrated in FIGS. 1 and 2 may identically employ the description of the components made with reference to FIGS. 1 and 2.

Figure 3:
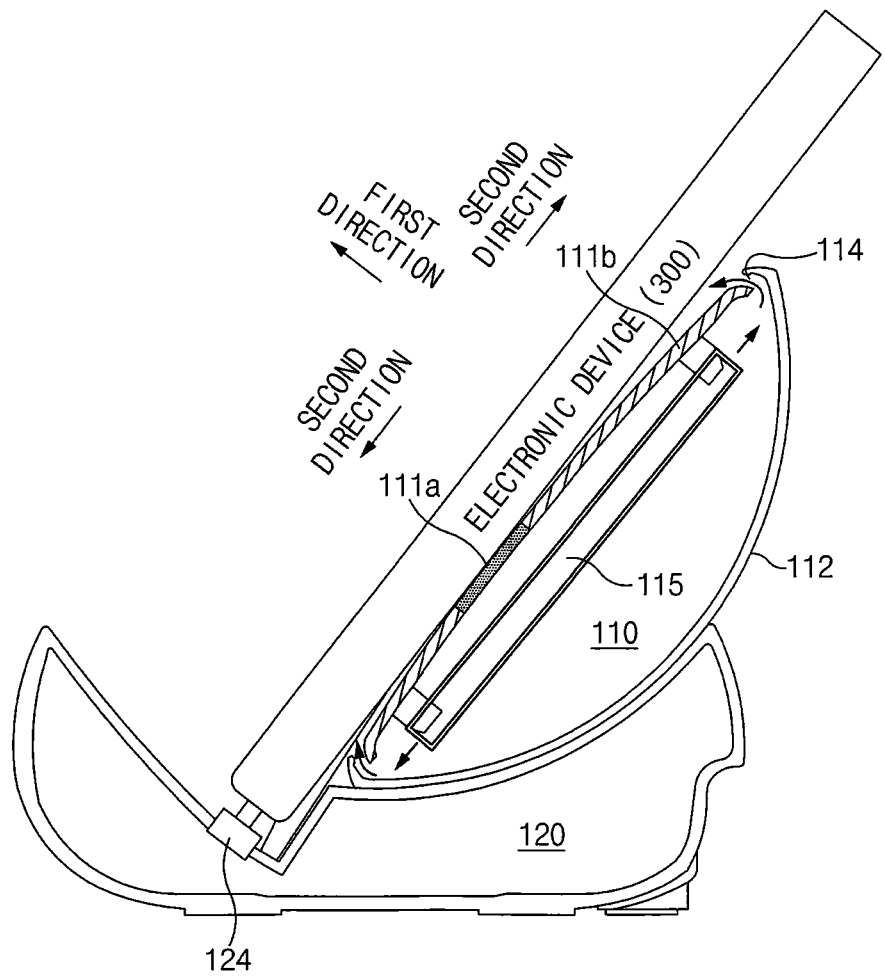
FIG. 3 illustrates the sectional view of a docking device coupled to the electronic device, according to an embodiment.

FIG. 3 illustrates the sectional view of the docking device coupled to the electronic device, according to an embodiment.

Referring to FIG. 3, a plurality of through holes 114 may be disposed in the rim of the front cover 111. In addition, the front cover 111 may be formed in a curved surface having a gentle curvature. In addition, a specific area, which is disposed with the groove 110a, of the front cover 111, may be flat and a more convex curved surface may be formed as a distance from the groove 110a may be increased to a specific distance or more. Accordingly, a partial area 111a of the front cover 111 may make contact with the electronic device 300 and an area 111b of the front cover 111 other than the partial area 111a does not make contact with the electronic device.

According to an embodiment, a fan 115 may be interposed between the front cover 111 and the rear cover 112 to generate wind. The wind generated from the fan 115 moves in a first direction (a forward direction facing the front cover 111) or a second direction (a lateral direction) and may come out of the blowing device 110 through the through holes 114. In this case, the through holes 114 may be bent such that the wind moves between the electronic device 300 and the front cover 111. The wind, which comes out of the blowing device 110 through the through holes 114, may reduce heat emitted from the electronic device 300.

According to an embodiment, the rim of the front cover 111 may be inclined at a specific angle toward the central portion of the front cover 111. Accordingly, the wind, which comes out of the through holes 114, may move toward the central portion of the front cover 111. The blowing device 110 concentrates the wind toward the central portion, thereby more effectively discharging heat emitted from the rear surface of the electronic device 300.

According to an embodiment, the stand device 120 may include a connector 124 (e.g., a USB connector) to electrically connect the electronic device 300 with the stand device 120. In general, the connector 124 may be hidden by the blowing device 110 and may be exposed when the inclination of the blowing device 110 may be a specific angle or more.

The stand device 120 may operate the fan 115 when the electronic device 300 is connected with the connector 124. Alternatively, the stand device 120 may enter the state (e.g., a waiting state) of supplying power to the fan 115 when the inclination of the blowing device 110 becomes a specific angle. In the waiting state, when the electronic device 300 is connected with the connector, the stand device 120 may operate the fan 115 by supplying the power to the fan 115.

Figure 4A:
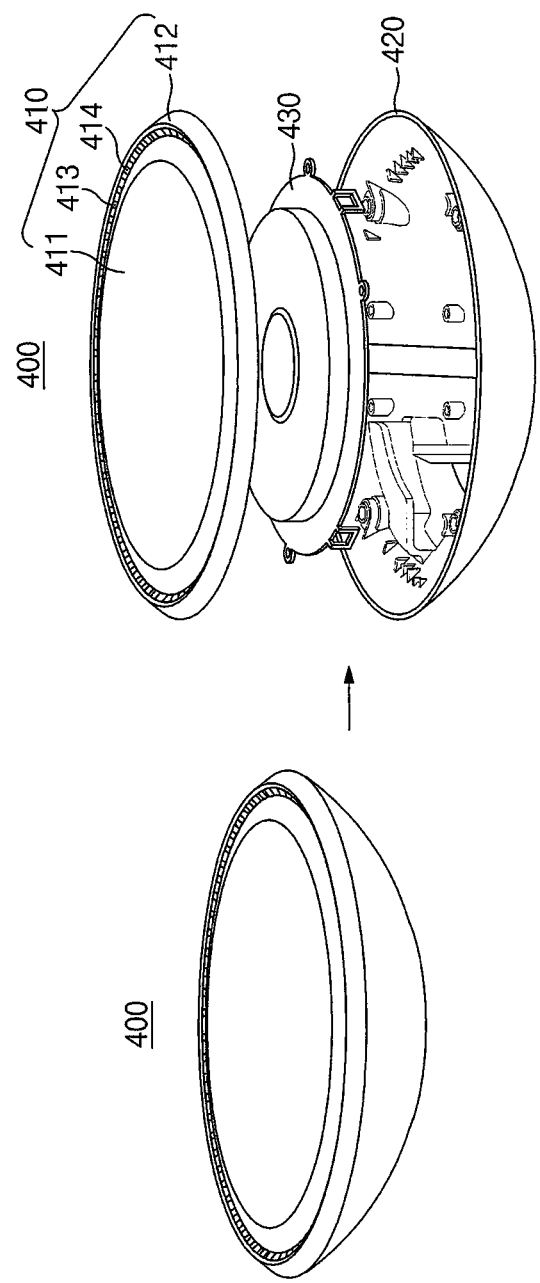
FIG. 4A illustrates a blowing device and an exploded perspective view of a blowing device, according to an embodiment.
Figure 4B:
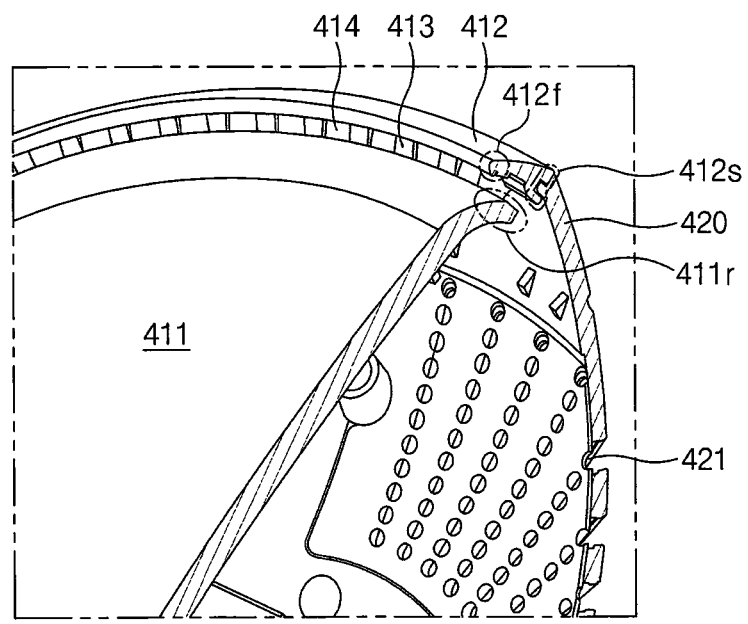
FIG. 4B illustrates an enlarged sectional view of a joint part between a main body and a guard, according to an embodiment.

FIG. 4A illustrates the blowing device and an exploded perspective view of the blowing device, according to an embodiment. FIG. 4B illustrates an enlarged sectional view of a joint part between a main body and a guard, according to an embodiment. Unless otherwise specified, the description of the blowing device 110 illustrated in FIGS. 1 and 3 may be applied to the blowing device 400 illustrated in FIGS. 4A and 4B.

Referring to FIGS. 4A and 4B, a front cover 410 includes a main body 411, a guard 412, coupling members (e.g., reference numeral 413), and a plurality of through holes 414.

The main body 411 may be a frame which at least partially makes contact with an electronic device, (e.g., a smartphone). An area, which makes contact with an electronic device, of the main body 411 may be flat or may have a curved surface having a gentle curvature, but a rim 411r of the main body 411 may be bent inward of the blowing device 400.

The guard 412 may surround the rim 411r of the main body 411. For example, the rim 411r of the main body 411 is curved inward of the blowing device 400, and the guard 412 may surround the curved surface. In this case, one end 412f of the guard 412 may be bent toward the center of the main body 411. An opposite end 412s of the guard 412 may be coupled to the rear cover 420.

The guard 412 may be spaced apart from the rim 411r of the main body 411 by a specific distance. The coupling members (e.g., reference numeral 413) may couple the guard 412 to the main body 411. Through holes (e.g., reference numeral 414), through which wind generated from the fan 430 may pass, may be disposed between the coupling members 413. The one end 412f of the guard 412 is bent toward the center of the main body 411 as described above. Accordingly, the through hole (e.g., reference numeral 414) may also be bent toward the central portion of the main body 411. Accordingly, the wind may move toward the central portion of the main body 411 through the through hole (e.g., reference numeral 414).

The rear cover 420 may be coupled to the opposite end 412s of the guard 412. In this case, the rear cover 420 may make close contact with the opposite end 412s of the guard 412 to prevent the wind from leaking between the rear cover 420 and the guard 412.

According to an embodiment, the rear cover 420 may include at least one exhaust hole 421. When the blowing device 400 generates and outputs wind, the external air may be introduced into the blowing device 400 through the exhaust holes 421. The fan 430 may generate wind using the introduced air.

Figure 5A:
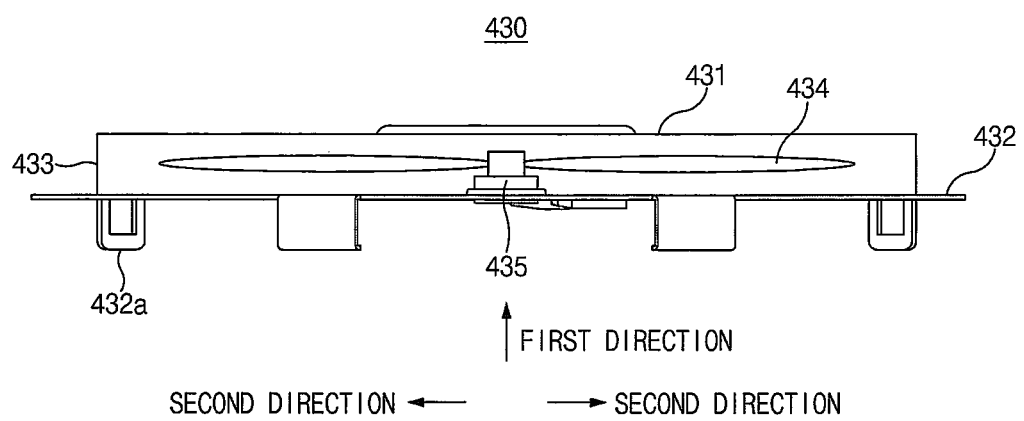
FIG. 5A illustrates a sectional surface of a fan 430, according to an embodiment.
Figure 5B:
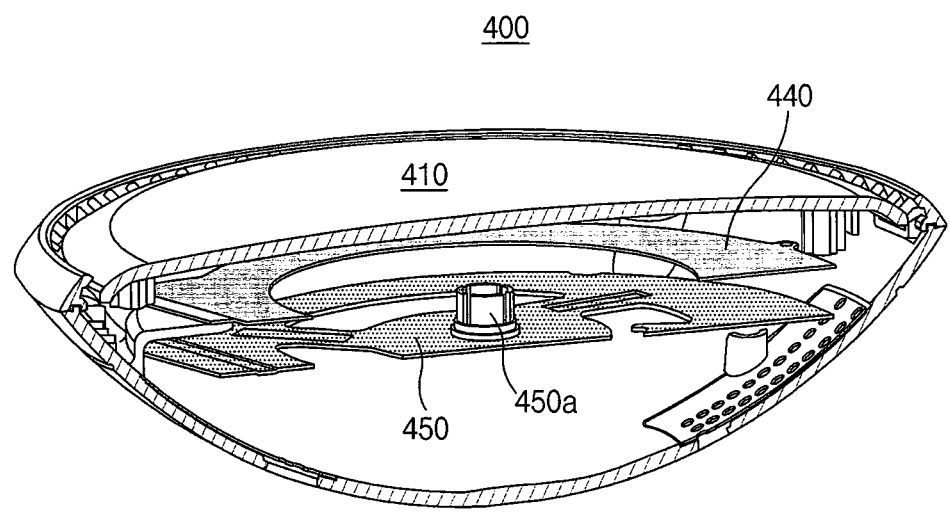
FIG. 5B illustrates a sectional view of a blowing device 400 according to an embodiment.

FIG. 5A illustrates a sectional view of the fan 430, according to an embodiment. FIG. 5B illustrates a sectional view of the blowing device 400 according to an embodiment.

Referring to FIG. 5A, the fan 430 may include a front plate 431, a rear plate 432 (e.g., a support), at least one pillar 433 to support the front plate 431 and the rear plate 432, a propeller 434, and a motor 435 to rotate the propeller 434. The front plate 431 may change the direction of the wind generated by the propeller 434. For example, the wind generated by the propeller 434 may be output in the first direction. When the front plate 431 is provided in a solid form with no holes through which the wind may pass, the wind output in the first direction may move in the second direction (lateral direction) after hitting the front plate 431. In this case, the wind may move to the rim of the front cover 410 after being discharged between the pillars 433.

The rear plate 432 may be coupled to the rear cover 420 to fix the fan 430 to the rear cover 420. For example, a coupling part 432a may be coupled to a partial area of the rear cover 420 to fix the fan 430 onto the rear cover 420. According to an embodiment, a hole may be provided in at least one side (e.g., the central portion) of the rear plate 432 such that air is introduced to the propeller 434.

Referring to FIG. 5B, the blowing device 400 may include a first support member 440 and a second support member 450. Parts included in the blowing device 400 may be disposed at the first support member 440 and the second support member 450. For example, the fan 430 may be interposed between the first support member 440 and the second support member 450. When the fan 430 is disposed between the first support member 440 and the second support member 450, an additional area 450a for disposing the motor 435 may be formed in the second support member 450.

According to an embodiment, a power transmission coil may be interposed between the front cover 410 and the first support member 440. When an electronic device (e.g., the electronic device 300 of FIG. 3) makes contact with the front cover 410, the power transmission coil may charge the electronic device 300 by transmitting power to the electronic device 300.

According to an embodiment, when the power transmission coil transmits power to the electronic device 300, the fan 430 may operate. When the power transmission coil transmits power to the electronic device 300, heat may be emitted from the electronic device 300. Accordingly, the blowing device 400 may reduce heat emitted from the electronic device 300 by operating the fan 430.

According to an embodiment, a communication coil may be disposed between the front cover 410 and the first support member 440. The communication coil may receive a signal associated with the operation of the fan 430 from the electronic device 300. For example, when the communication coil receives a signal for requesting for the operation of the fan 430 from the electronic device 300, the blowing device 400 may reduce heat emitted from the electronic device 300 by operating the fan 430.

Figure 6:
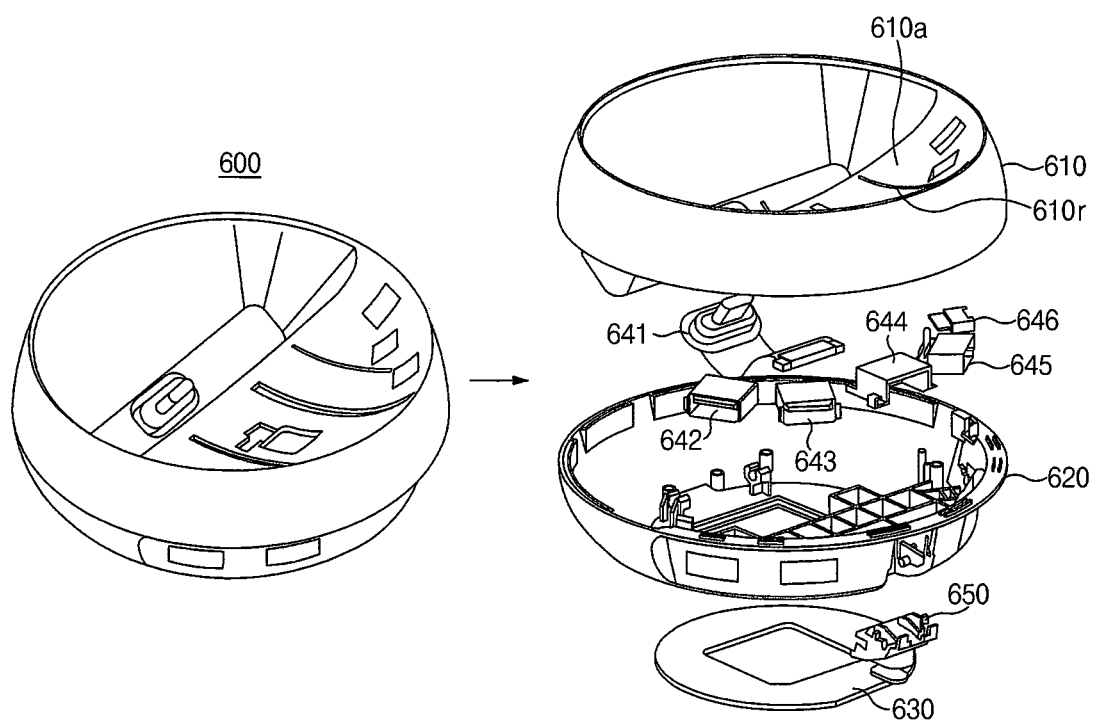
FIG. 6 illustrates a stand device and an exploded perspective view of the stand device, according to an embodiment.

FIG. 6 illustrates a stand device and an exploded perspective view of the stand device, according to an embodiment. Unless otherwise specified, the description of the stand device 120 illustrated in FIGS. 1 and 3 may be applied to a stand device 600 illustrated in FIG. 6.

Referring to FIG. 6, the stand device 600 may include a front housing 610, a side housing 620, and a rear housing 630.

The front housing 610 may be coupled to a blowing device (e.g., the blowing device 110 of FIG. 1). A surface 610a of the front housing 610 may be curved such that the blowing device 120 slidably moves on the front housing 610. At least one track 610r may be formed on the surface 610a of the front housing 610 such that the blowing device 120 moves in a specific direction.

USB connectors 641 to 646 may be mounted on the side housing 620. For example, a standard USB connector, a mini-USB connector, a micro-USB connector, and the like may be mounted on the side housing 620. According to an embodiment, the USB connectors 641 to 646 may electrically connect the electronic device (e.g., the electronic device 300 of FIG. 3) with an external device (e.g., TV or PC). In addition, the USB connectors 641 to 646 may transmit data stored in the electronic device 300 to the external device.

The rear housing 630 may be coupled to the side housing 620. The rear housing 630 may be equipped with a terminal 650 to receive power. The stand device 600 may be connected with a power source through the terminal 650, and may charge the electronic device 300 with power received from the power source.

FIG. 7 illustrates a block diagram of the docking device, according to an embodiment.

Referring to FIG. 7, a docking device 700 may include a sensor 710, a memory 720, a processor 730, a motor 740, and a propeller 750. The sensor 710, the memory 720, the processor 730, the motor 740 and/or the propeller 750 illustrated in FIG. 7 may be included in the blowing device 400 (e.g., the blowing device 110 of FIG. 1) or the stand device (e.g., the stand device 120 of FIG. 1). In the disclosure, the processor 730 may be referred to as a microcomputer or a controller.

The sensor 710 may sense the inclination of the blowing device 110. For example, the sensor 710 may sense the inclination of the blowing device 110 by using magnets disposed in each of the blowing device 110 and the stand device 120, respectively.

The memory 720 may store programs associated with the operation of the motor 740. For example, the memory 720 may store a program (e.g., a first program) to control whether the motor 740 operates, based on the inclination of the blowing device 110, and a program (e.g., a second program) to control whether the motor 740 operates, based on the wireless charging state.

The processor 730 may be electrically connected to the sensor 710, the memory 720, and the motor 740, respectively. The processor 730 may sense the inclination of the blowing device 110 through the sensor 710. When the inclination is sensed, the processor 730 may turn on the motor 740 based on the first program stored in the memory 720. The motor 740 turned on under the control of the processor 730 may rotate the propeller 750 to generate and output wind. Unlike the above embodiment, the processor 730 may turn on the motor 740 based on the second program when wireless charging is started.

According to an embodiment, when the inclination of the blowing device 110 corresponds to a specific value, the sensor 710 may switch the processor 730 from a sleep state to an active state. According to another embodiment, the sensor 710 may switch the processor 730 from the sleep state to the active state, when the touch of a user is sensed on the front cover 111 (e.g., the groove 110a).

In the disclosure, the sleep state may refer to a lower-power mode, and the active state may refer to the state that the processor 730 is waiting so as to turn on the motor 740.

According to another embodiment, the active state may refer to the state that the motor 740 does not operate, even though the processor 730 applies power to the motor 740. When the electronic device 300 is connected with the connector (e.g., the connector 124 of FIG. 3), the processor 730, which is activated, may control the propeller 750 to rotate by turning on the motor 740.

Figure 8A:
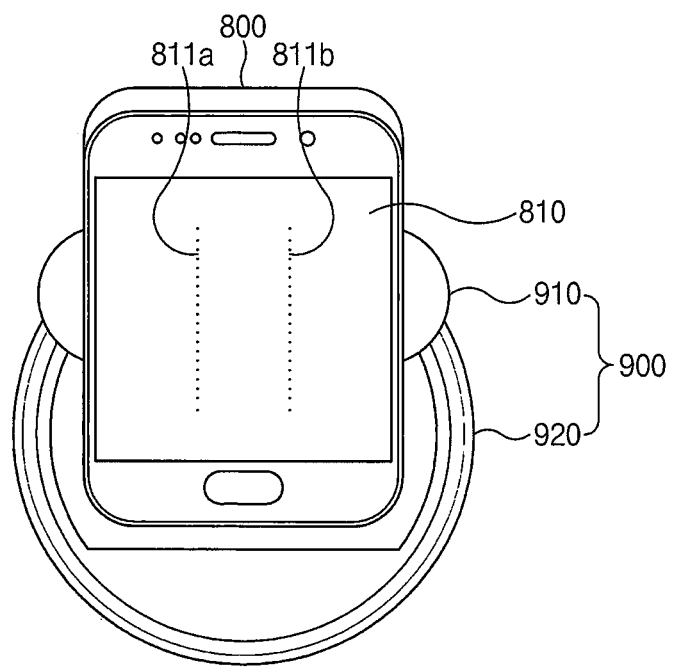
FIG. 8A illustrates a docking device coupled to the electronic device, according to another embodiment.
Figure 8B:
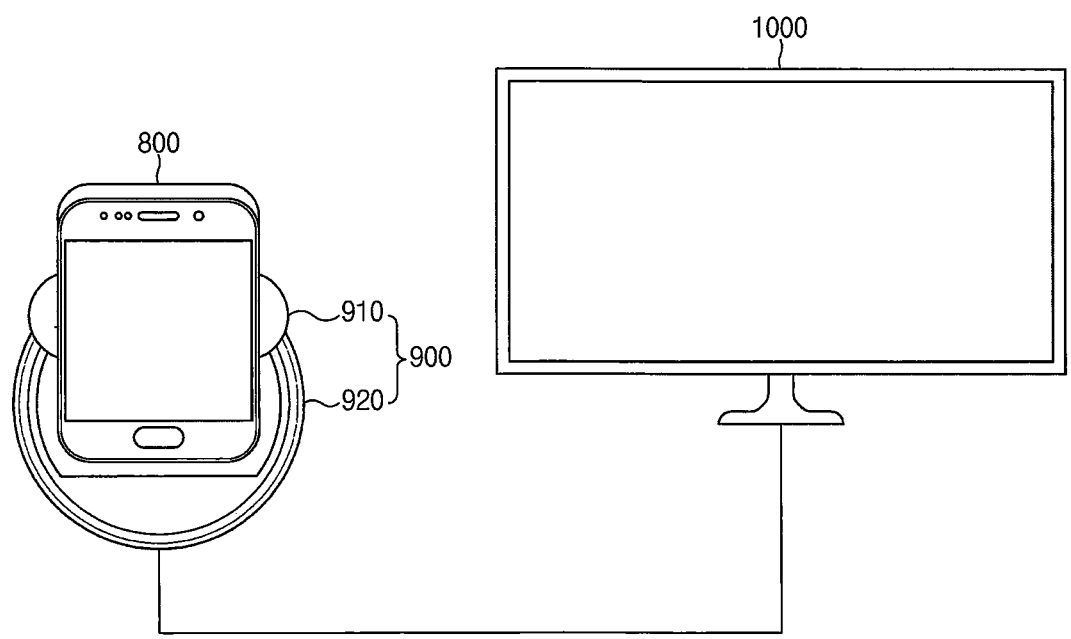
FIG. 8B illustrates an electronic device connected with an external device, according to still another embodiment.

FIG. 8A illustrates a docking device coupled to an electronic device, according to another embodiment. FIG. 8B illustrates an electronic device connected with an external device, according to still another embodiment. Unless otherwise specified, the description of the docking device 100 illustrated in FIG. 1 may be applied to a docking device 900 illustrated in FIGS. 8A and 8B.

Referring to FIGS. 8A and 8B, the docking device 900 may a short-range wireless communication coil (e.g., a coil for a near field communication (NFC)) and a proximity sensor. The short-range wireless communication coil and/or the proximity sensor may be included in a blowing device 910 or a stand device 920

The short-range wireless communication coil and/or the proximity sensor may sense whether an electronic device 800 is the proximity of the docking device 900 and whether the electronic device 800 is mounted on the docking device 900. According to one embodiment, when the electronic device 800 is in the proximity of the docking device 900, the short-range wireless communication coil may transmit data associated with guidelines 811a and 811b to the electronic device 800. The electronic device 800 may receive the data and output the guidelines 811a and 811b to a display. The user may easily mount the electronic device 800 on the docking device 900 using the guide lines 811a and 811b.

According to one embodiment, the electronic device 800 may be connected with an external device 1000 (e.g., a TV or PC) through the short-range wireless communication coil and/or the connector (e.g., the connector 124 of FIG. 3). When the electronic device 800 is connected with the external device 1000, the electronic device 800 may transmit data (e.g., content) through the short-range communication coil and/or the connector. The external device 1000 may receive and output the content from the electronic device 800.

According to an embodiment of the disclosure, a docking device to mount an electronic device may include a blowing device to generate and output wind, and a stand device to support the blowing device. The blowing device may include a front cover, which includes a main body at least partially making contact with the electronic device, a guard that surrounds the main body and is spaced apart from the main body by a specific distance, and a plurality of through holes that are disposed at a rim of the main body, a rear cover coupled to the front cover to slide on the stand device based on physical force applied onto the front cover, and a fan interposed between the front cover and the rear cover. One end of the guard may be bent toward the center of the main body, and an opposite end of the guard may be coupled to the rear cover. The stand device may include a housing including a groove having a shape corresponding to the rear cover such that at least a portion of the front cover is positioned in the housing, when the rear cover slides, a sensor to sense an angle at which the front cover is inclined in the housing, and a processor to control an operation speed of the fan based on the angle sensed by the sensor.

According to an embodiment of the disclosure, a first area, which makes contact with the electronic device, of the main body may have an inclination different from an inclination of a second area, which does not contact with the electronic device, of the main body.

According to an embodiment of the disclosure, the front cover may include a plurality of connecting members to connect the main body with the guard, between the through holes.

According to an embodiment of the disclosure, the fan may include a front plate, a rear plate opposite to the front plate, a propeller interposed between the front plate and the rear plate, and a motor to rotate the propeller.

According to an embodiment of the disclosure, the docking device may further include a coupling unit disposed on the rear plate to couple the rear plate to the rear cover.

According to an embodiment of the disclosure, the front cover, the front plate, and the rear plate may be parallel to each other, and the wind generated by the fan may move between the front plate and the rear plate.

According to an embodiment of the disclosure, the through holes may be bent to allow the wind, which passes through the front plate and the rear plate, to move to the electronic device making contact with the front cover.

According to an embodiment of the disclosure, the rear cover may include at least one or more holes such that air is introduced into the fan.

According to an embodiment of the disclosure, the docking device may include a plurality of magnets provided on each of the rear cover and the housing, and the sensor may sense the angle based on a magnetic field formed between the magnets.

According to an embodiment of the disclosure, the stand device may further include a connector to connect the electronic device with the processor.

According to an embodiment of the disclosure, the sensor may switch the processor from a sleep state to an active state, when the angle corresponds to a specific value, and the processor may turn on the fan when the electronic device is coupled to the connector.

According to an embodiment of the disclosure, the processor may control an operation speed of the fan to decrease as the sensed angle is increased.

According to an embodiment of the disclosure, the blowing device may include a power transmission coil, and the processor may transmit power through the power transmission coil while operating the fan at a specified time point when the electronic device is positioned within a specific distance.

According to an embodiment of the disclosure, at least one or more tracks may be formed on a surface, which makes contact with the rear cover, of the housing to control the rear cover to slide in a specific direction.

According to an embodiment of the disclosure, a blowing device may include a rear cover including a plurality of holes allowing external air to be introduced into the blowing device, a fan to generate wind by rotating the introduced external air, and a front cover including at least one or more through holes which are disposed at a rim and allow the wind to pass through the holes. The fan may include a front plate parallel to the front cover, a rear plate opposite to the front plate, a propeller disposed in parallel to the front plate, between the front plate and the rear plate, and a motor to rotate the propeller. The through holes may be bent such that the wind passing between the front plate and the rear plate moves to an electronic device making contact with the front cover.

According to an embodiment of the disclosure, the front cover may include a main body at least partially making contact with the electronic device and a guard that surrounds the main body and is spaced apart from the main body by a specific distance. The through holes may be interposed between the main body and the guard.

According to an embodiment of the disclosure, the front cover may further include a connection member to connect the main body with the guard.

According to an embodiment of the disclosure, a first area, which makes contact with the electronic device, of the main body may have an inclination different from an inclination of a second area, which does not contact with the electronic device, of the main body.

According to an embodiment of the disclosure, the blowing device may be coupled to each of the front plate and the rear plate, and may further include a first support member and a second support member.

According to an embodiment of the disclosure, the blowing device may include a power transmission coil interposed between the front cover and the fan, and the power transmission coil may transmit power to the electronic device.

The invention claimed is:

1. A docking device to mount an electronic device, the docking device comprising:
    a blowing device to generate an output wind; and
    a stand device to support the blowing device,
    wherein the blowing device comprises:
    a front cover that includes a main body at least partially making contact with the electronic device;
    a guard that surrounds the main body and is spaced apart from the main body by a specific distance; and
    a plurality of through holes that are disposed at a rim of the main body;
    a rear cover coupled to the front cover to slide on the stand device based on physical force applied onto the front cover; and
    a fan interposed between the front cover and the rear cover,
    wherein one end of the guard is bent toward the center of the main body, and an opposite end of the guard is coupled to the rear cover, wherein the stand device comprises:
a housing including a groove having a shape corresponding to the rear cover such that at least a portion of the front cover is positioned in the housing, when the rear cover slides;
a sensor to sense an angle at which the front cover is inclined in the housing; and
a processor to control an operation speed of the fan based on the angle sensed by the sensor.

2. The docking device of claim 1, wherein a first area, which makes contact with the electronic device, of the main body has an inclination different from an inclination of a second area, which does not contact with the electronic device, of the main body.

3. The docking device of claim 1, wherein the front cover comprises:
a plurality of connecting members to connect the main body with the guard, between the through holes.

4. The docking device of claim 1, wherein the fan comprises:
a front plate, a rear plate opposite to the front plate, a propeller interposed between the front plate and the rear plate, and a motor to rotate the propeller.

5. The docking device of claim 4, further comprising:
a coupling unit disposed on the rear plate to couple the rear plate to the rear cover.

6. The docking device of claim 4, wherein the front cover, the front plate, and the rear plate are parallel to each other, and
wherein the wind generated by the fan moves between the front plate and the rear plate.

7. The docking device of claim 6, wherein the through holes are bent to allow the wind, which passes through the front plate and the rear plate, to move to the electronic device making contact with the front cover.

8. The docking device of claim 1, wherein the rear cover includes:
at least one or more holes such that air is introduced into the fan.

9. The docking device of claim 1, further comprising:
a plurality of magnets provided on each of the rear cover and the housing,
wherein the sensor senses the angle based on a magnetic field formed between the magnets.

10. The docking device of claim 1, wherein the stand device further comprises:
a connector to connect the electronic device with the processor.

11. The docking device of claim 10, wherein the sensor switches the processor from a sleep state to an active state, when the angle corresponds to a specific value, and
wherein the processor turns on the fan when the electronic device is coupled to the connector.

12. The docking device of claim 1, wherein the processor controls an operation speed of the fan to decrease as the sensed angle is increased.

13. The docking device of claim 1, wherein the blowing device includes:
a power transmission coil, and
wherein the processor transmits power through the power transmission coil while operating the fan at a specified time point when the electronic device is positioned within a specific distance.

14. The docking device of claim 1, wherein at least one or more tracks are formed on a surface, which makes contact with the rear cover, of the housing to control the rear cover to slide in a specific direction.

15. A blowing device comprising:
a rear cover including a plurality of holes allowing external air to be introduced into the blowing device;
a fan to generate wind by rotating the introduced external air; and
a front cover including at least one or more through holes which are disposed at a rim thereof and allow the wind to pass through the holes,
wherein the fan includes:
a front plate parallel to the front cover;
a rear plate opposite to the front plate;
a propeller disposed in parallel to the front plate, between the front plate and the rear plate; and
a motor to rotate the propeller, and
wherein the through holes are bent such that the wind passing between the front plate and the rear plate moves to an electronic device making contact with the front cover.

* * * * *